United States Patent [19]

Boskamp

[11] Patent Number: 4,816,765
[45] Date of Patent: Mar. 28, 1989

[54] MAGNETIC RESONANCE IMAGING APPARATUS COMPRISING A QUADRATURE COIL SYSTEM

[75] Inventor: Eddy B. Boskamp, Eindhoven, Netherlands

[73] Assignee: U.S. Philips Corporation, New York, N.Y.

[21] Appl. No.: 117,118

[22] Filed: Nov. 4, 1987

[30] Foreign Application Priority Data

Nov. 27, 1986 [NL] Netherlands .......................... 8603005

[51] Int. Cl.$^4$ ............................................. G01R 33/20
[52] U.S. Cl. ...................................... 324/318; 324/322
[58] Field of Search ............... 324/300, 307, 309, 318, 324/319, 320, 322

[56] References Cited

U.S. PATENT DOCUMENTS

| | | | |
|---|---|---|---|
| 4,636,730 | 1/1987 | Bottomley | 324/322 |
| 4,648,405 | 3/1987 | Keren | 324/309 |
| 4,685,468 | 8/1987 | Macovski | 324/309 |
| 4,721,913 | 1/1988 | Hyde et al. | 324/318 |

Primary Examiner—Michael J. Tokar
Attorney, Agent, or Firm—Thomas A. Briody; Jack E. Haken; Jack D. Slobod

[57] ABSTRACT

The detection coil of a magnetic resonance imaging apparatus comprises a stack of two coils with locally mutually perpendicularly directed B Fields. The first coil is formed as a butterfly coil having a B field extending parallel to the plane of the coil, the second coil being formed by a single flat coil having a B field extending transversely of the plane of the coil. The coils are arranged in a fixed mutual orientation so that for each of the coils reciprocally applied fluxes are always compensated for.

8 Claims, 1 Drawing Sheet

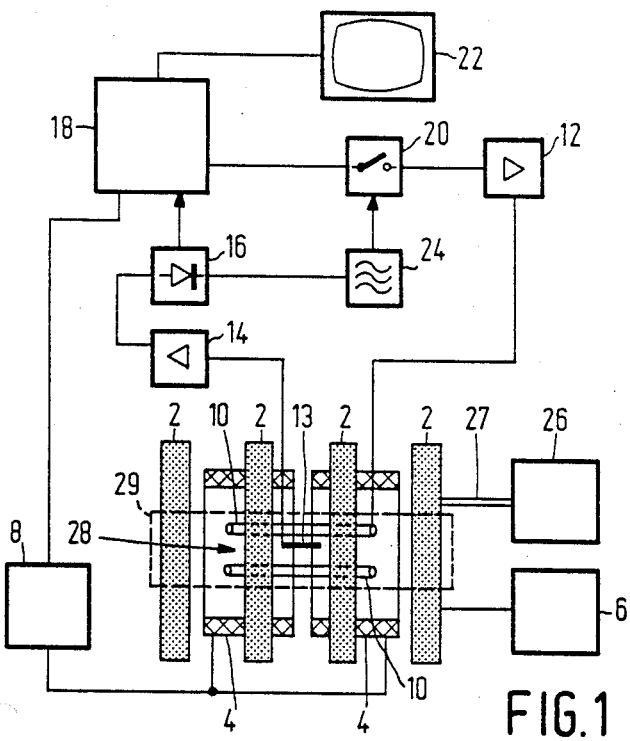
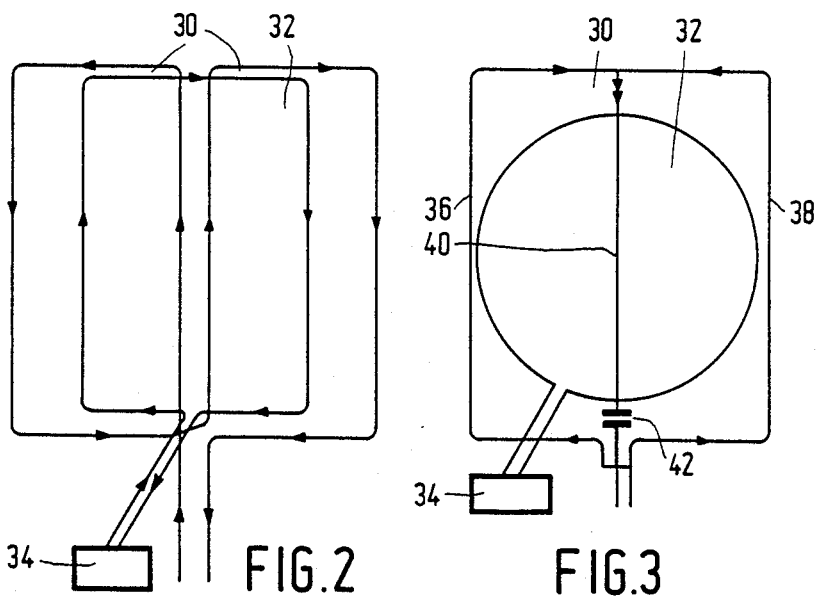
FIG.1
FIG.2    FIG.3

MAGNETIC RESONANCE IMAGING APPARATUS COMPRISING A QUADRATURE COIL SYSTEM

The invention relates to a magnetic rasonance imaging apparatus, comprising a magnet system for generating a steady magnetic field, a magnet system for generating magnetic gradient fields, an rf transmitter coil and an rf quadrature surface coil system for detecting magnetic resonance signals generated in an object.

An apparatus of this kind is known from EP No. 196134 which described a method of reducing undesirable crosstalk between coils of the quadrature coil system. This increases the field of application for such a system in comparison with the previously known solution where a strictly orthogonal configuration must be maintained. The repeated detuning of a section of the coil system, however, is found to be objectionable, the more so because electronic circuits are also added to the coils for uncoupling the transmitter coil and the measuring coil device.

It is the object of the invention to mitigate the above restrictions and to avoid the drawbacks of exact uncoupling; to achieve this, a magnetic resonance imaging apparatus of the kind set forth in accordance with the invention is characterized in that the quadrature rf coil system comprises a stack of two flat coils with locally a mutually perpendicular magnetic field direction as well as with a reciprocal magnetic flux which is self-compensating for each of the coils.

Because in an apparatus in accordance with the invention each time two coils with mutually perpendicularly directed B fields are combined, measurement can be performed in two mutually perpendicular directions and crosstalk between the coils can be avoided by correct orientation of the coils with respect to one another. A coil system of this kind can be arranged in the measurement space with a high degree of freedom, because correct mutual orientation will now be automatically retained.

It is to be noted that a system of this kind, be it in the form of essentially non-flat coils, is known from the Book of Abstracts of the Society of Magnetic Resonance in Medicine, Fifth Annual Meeting, August 19–22, 1986, Montreal, pages 187 and 188. In addition to their low requirements as regards space, the major advantage of flat coils consists in their high degree of flexibility so that, for example curved coil systems are also feasible.

A preferred embodiment utilizes a stack consisting of a butterfly coil and an ordinary coil. Use is then made of the fact that the magnetic field of a butterfly coil is directed perpendicularly to the direction of the magnetic field of a single surface coil when both coils are situated in one and the same plane. For a more detailed description of butterfly coils, reference is made to EP No. 218290. When use is made of butterfly coils which are situated in a flat plane and which are geometrically rigid and suitably oriented in the transmission field, an additional advantage is obtained in that, in the case of a uniform transmission field, these coils do not require uncoupling against influencing by the transmitter coil, so that the uncoupling system will be comparatively simple. If these conditions are not adequately satisfied, uncoupling can take place in a conventional manner, for example as described in EP No. 164164.

The criterion of the invention will be satisfied for as long as the direction of the B field is suitably defined for each of the constituent coils and the coils can be stacked so that both magnetic fields are directed so as to be mutually perpendicular and no effective reciprocal magnetic flux is induced through the coils. Within this range of possibilities, any desired coil shape can be used, for example also a rectangular butterfly coil and a round or elliptical single flat coil or a roof-shaped butterfly coil and a suitably adapted second coil. In the latter case part of the flexibility of the coil system will be lost, but a specific shape will be achieved for the system.

A further preferred embodiment utilizes, in addition to a single flat coil, a butterfly coil which is uncoupled by a capacitance. Such a coil can also be constructed as a flat flexible coil and be used as such in a quadrature coil stack in accordance with the invention.

Some preferred embodiments in accordance with the invention will be described in detail hereinafter with reference to the drawing. Therein:

FIG. 1 shows a magnetic resonance imaging apparatus comprising a stacked coil system in accordance with the invention, and FIGS. 2 and 3 show preferred embodiments of stacked coil systems for such an apparatus.

A magnetic resonance imaging apparatus as shown in FIG. 1 comprises a magnet system 2 for generating a steady, uniform magnetic field, a magnet system 4 for generating magnetic gradient fields, and power supply sources 6 and 8 for the magnet system 2 and the magnet system 4, respectively. A magnet coil 10 serves to generate an rf magnetic alternating field and is connected to an rf source 12. For detection of magnetic resonance signals generated in an object to be examined by the rf transmission field there is included a surface coil system 13. For reading purposes, the system 13 is connected to a signal amplifier 14. The signal amplifier 14 is connected to a phase-sensitive rectifier 16 which is connected to a central control device 18. The central control device 18 also controls a modulator 20 for the rf source 12, the supply source 8 for the gradient coils, and a monitor 22 for display. An rf oscillator 24 controls the modulator 20 as well as the phase-sensitive rectifier 16 which processes the measurement signals. Cooling can be provided by a cooling device 26 comprising cooling ducts 27. A cooling device of this kind may be constructed as a water cooling system for resistance coils or as a liquid helium dewar system for superconducting coils. The transmitter coil 10, arranged within the magnet systems 2 and 4, encloses a measurement space 28 which offers sufficient room so as to accommodate patients in medical diagnostic apparatus. Thus, a steady magnetic field, gradient fields for position selection of slices to be imaged, and a spatially uniform rf alternating field can be generated in the measurement space 28. The measurement space is shielded against interferene fields by a Faraday cage 29.

Detection coil systems composed of surface coils are not very suitable for use as transmitter coils for generating magnetic resonance signals. The dual function used for other types of coils, therefore, is less suitable for these coils, even though it is not precluded for specific measurements in practice.

FIG. 2 shows a quadrature surface coil system which is composed of a butterfly coil 30 and a second coil 32. Due to the geometry, the butterfly coil 30 is uncoupled for the transmission field to be used but, because uncoupling does not exist for the second coil 32, an uncoupling circuit 34 is added thereto. The circumferential shape of the coils can be chosen at random and may also be, for example substantially circular or elliptical. In an embodiment as shown in FIG. 3, the single flat coil 32 is constructed so as to be circular and is again connected to an uncoupling mechanism 34. The composite coil 30 in this case comprises two conductors 36 and 38, having the same inductance, and a conductor 40 which is arranged symmetrically therebetween. The conductor 40 includes a capacitance 42 so that the coil is uncoupled in respect of transmission fields which load both coil halves to the same extent. From a point of view of symmetry, and hence a smaller risk of residual coupling between the coils themselves, the surface of the single flat coil 32 is preferably distributed exactly between the two halves of the composite coil 30. the surface coil as well as the second coil may be truly flat coils, which means that the conductors need not have a given dimension in a direction perpendicular to the coil surface for the sake of correct operation. Therefore, for the conductors use can be made of thin metal strips which result in an extremely well deformable coil system when they are provided with an uncoupling circuit and arranged together on a flexible support. These coils can also be arranged in any orientation and in any location in the measurement space, regardless of the direction of a spatially uniform transmission field. For suitable detection of, for example regions which are situated deeper within the object, use can be made of such a coil system comprising two coil stacks which are arranged opposite one another on both sides of the object to be examined. Coil stacks of this kind can also be used to form cascade systems in order to extend the region to be measured in an object while maintaining a comparatively good signal-to-noise ratio. For a more detailed description of the cascade systems, reference is made to the Application filed by Applicant simultaneously with the present Application. For customary measurements utilizing surface coils, the coil system in accordance with the invention may be included, for example in a flexible band which is locally arranged on he object to be examined.

What is claimed is:

1. A magnetic resonance imaging apparatus comprising a magnet system for generating a steady magnetic field, a magnet system for generating magnetic gradient fields, an r-f transmitter coil and an r-f quadrature surface coil system for detecting resonance signals generated in an object, wherein said quadrature r-f coil system comprises a stack of two flat coils mounted on a flexible support with a mutually perpendicular magnetic field direction as well as with a reciprocal magnetic flux which is self-compensating for each of the coils, and an uncoupling mechanism coupled to at least one of said coils.

2. A magnetic resonance imaging apparatus as claimed in claim 1, characterized in that a first coil is formed by a butterfly coil and a second coil is formed by a single flat coil.

3. A magnetic resonance imaging apparatus as claimed in claim 1, characterized in that the second coil comprises two identical wings, each of which comprises an outer conductor having the same inductance and a common conductor in which there is included an uncoupling capacitor.

4. A magnetic resonance imaging apparatus as claimed in claim 2, characterized in that the surface of the second coil is equally distributed between the two wings of the butterfly coil.

5. A magnetic resonance imaging apparatus as claimed in any one of claim 1, 2, 3 or 4, characterized in that both coils comprise an uncoupling mechanism and are mounted on a flexible support.

6. A magnetic resonance imaging apparatus as claimed in any one of claims 1-4 characterized in that the coils comprise thin metal strips which are deformable.

7. A magnetic resonance imaging apparatus as claimed in claim 5, characterized in that the butterfly coil is roof-shaped, the second coil being adapted so as to be distributed over both roof halves.

8. A magnetic resonance imaging apparatus as claimed in claim 5, characterized in that the detection coil system comprises a plurality of stacked quadrature coils which are cascade-connected with a partial overlap.

* * * * *